(12) United States Patent  
Chatterjee et al.

(10) Patent No.: US 9,390,210 B2  
(45) Date of Patent: Jul. 12, 2016

(54) LOGIC ABSORPTION TECHNIQUES FOR PROGRAMMABLE LOGIC DEVICES

(71) Applicant: Lattice Semiconductor Corporation, Hillsboro, OR (US)

(72) Inventors: Nilanjan Chatterjee, Cupertino, CA (US); Venkatesan Rajappan, Fremont, CA (US); Mohan Tandyala, San Jose, CA (US)

(73) Assignee: LATTICE SEMICONDUCTOR CORPORATION, Portland, OR (US)

( * ) Notice: Subject to any disclaimer, the term of this patent is extended or adjusted under 35 U.S.C. 154(b) by 0 days.

(21) Appl. No.: 14/509,564

(22) Filed: Oct. 8, 2014

(65) Prior Publication Data

US 2015/0347642 A1 Dec. 3, 2015

Related U.S. Application Data

(60) Provisional application No. 62/005,711, filed on May 30, 2014.

(51) Int. Cl.
*G06F 17/50* (2006.01)

(52) U.S. Cl.
CPC .......... *G06F 17/505* (2013.01); *G06F 17/5054* (2013.01)

(58) Field of Classification Search
CPC .................................................. G06F 17/5045
USPC .......................................................... 716/104
See application file for complete search history.

(56) References Cited

U.S. PATENT DOCUMENTS

| | | | | |
|---|---|---|---|---|
| 5,519,627 A * | 5/1996 | Mahmood | ........... | G06F 17/5045 716/103 |
| 6,505,337 B1 * | 1/2003 | Wittig | ................ | H03K 19/1737 326/38 |
| 7,337,100 B1 * | 2/2008 | Hutton | ................ | G06F 17/5068 703/13 |
| 7,506,298 B1 * | 3/2009 | Ingoldby | ............. | G06F 17/5054 716/104 |
| 7,580,824 B1 * | 8/2009 | Lewis | ................ | G06F 17/5036 703/14 |
| 7,886,256 B1 * | 2/2011 | Jha | ....................... | G06F 17/5031 716/108 |
| 2004/0133869 A1 * | 7/2004 | Sharma | ............... | G06F 17/5054 716/116 |
| 2005/0229141 A1 * | 10/2005 | Kawa | .................. | G06F 17/5068 716/104 |

OTHER PUBLICATIONS

Lewis; The Stratix II Logic and Routing Architecture; Feb. 20, 2005; pp. 14-20.*

Lodi; A Flexible LUT-Based Carry Chain for FPGAS; 2003; pp. 133-136.*

* cited by examiner

*Primary Examiner* — Suresh Memula

(57) ABSTRACT

Various techniques are provided to efficiently implement user designs in programmable logic devices (PLDs). In one example, a computer-implemented method includes receiving a design identifying operations to be performed by a programmable logic device (PLD). The computer-implemented method also includes synthesizing the design into a plurality of PLD components comprising a first logic block cascaded into a second logic block. In the computer-implemented method, the second logic block implements a multiplexer adapted to selectively pass a first multi-bit input signal received from the first logic block or a second multi-bit input signal. The computer-implemented method also includes further synthesizing the design to absorb the multiplexer into the first logic block.

15 Claims, 6 Drawing Sheets

US 9,390,210 B2

LOGIC ABSORPTION TECHNIQUES FOR PROGRAMMABLE LOGIC DEVICES

CROSS-REFERENCE TO RELATED APPLICATIONS

This application claims the benefit of U.S. Provisional Patent Application No. 62/005,711, filed May 30, 2014 which is hereby incorporated by reference in its entirety.

TECHNICAL FIELD

The present invention relates generally to programmable logic devices and, more particularly, to the synthesis of user designs implemented in such devices.

BACKGROUND

Programmable logic devices (PLDs) (e.g., field programmable gate arrays (FPGAs), complex programmable logic devices (CPLDs), field programmable systems on a chip (FPSCs), or other types of programmable devices) may be configured with various user designs to implement desired functionality. Typically, the user designs are synthesized and mapped into configurable resources (e.g., programmable logic gates, look-up tables (LUTs), embedded hardware, or other types of resources) and interconnections available in particular PLDs. Physical placement and routing for the synthesized and mapped user designs may then be determined to generate configuration data for the particular PLDs.

User designs often require cascading of interconnected configurable resources (e.g., outputs of LUTs feeding a next level of LUTs) when synthesized. This cascading of configurable resources leads to an increased propagation delay, which in turn results in an increased clock period and reduced clock frequency for the PLD. Moreover, such user designs may also waste configurable resources and interconnections, especially if some of the configured resources are only partially utilized.

BRIEF DESCRIPTION OF THE DRAWINGS

Embodiments of the present disclosure and their advantages are best understood by referring to the detailed description that follows. It should be appreciated that like reference numerals are used to identify like elements illustrated in one or more of the figures.

DETAILED DESCRIPTION

Figure 1:
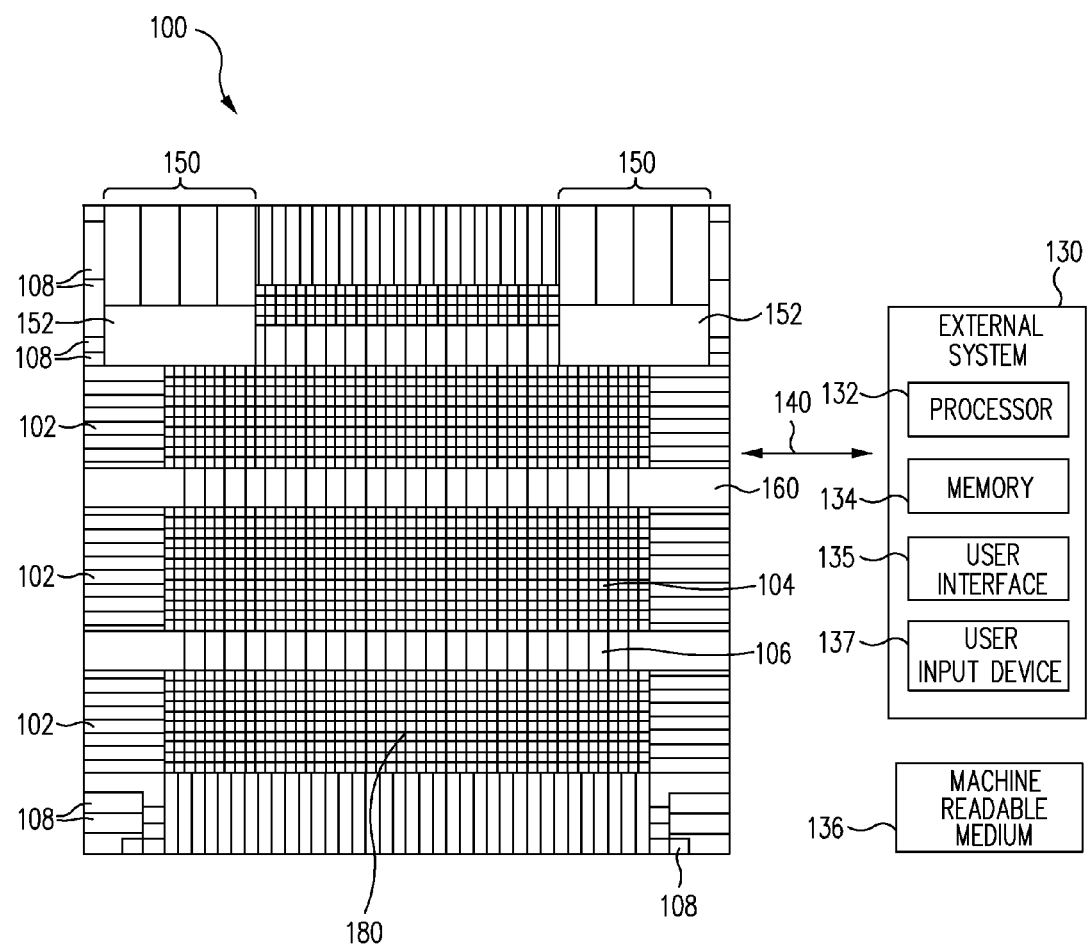
FIG. 1 illustrates a block diagram of a programmable logic device (PLD) in accordance with an embodiment of the disclosure.

In accordance with embodiments set forth herein, techniques are provided to efficiently implement user designs in programmable logic devices (PLDs). In various embodiments, a user design may be converted into and/or represented by a set of PLD components (e.g., configured for logic, arithmetic, or other hardware functions) and their associated interconnections available in a PLD. In various embodiments, a logic absorption process (e.g., also referred to as an optimization process) may be performed on the user design to reduce propagation delays and/or consumption of PLD resources and interconnections. In some embodiments, the various techniques described herein may be applied to PLDs in the iCE40 family devices available from Lattice Semiconductor Corporation, or other devices as appropriate.

In some embodiments, such a process includes identifying an instance of a logic gate feeding a multiplexer which, when a PLD is configured to implement the user design, would introduce multiple PLD components (e.g., LUTs) in a cascaded arrangement. For example, in such a cascaded arrangement, an output of a first configurable PLD component implementing the logic gate may feed an input of a second configurable PLD component implementing the multiplexer. In some cases, the configurable PLD component associated with the logic gate may not be fully utilized. For example, one or more inputs of a LUT may be unused. Upon identifying such instances, a logic absorption process may absorb the multiplexer into the configurable PLD component associated with the logic gate (e.g., by reassigning associated signals such that inputs to the multiplexer are mapped to the configurable PLD component for the logic gate and a select signal for the multiplexer is shared with the at least one constant input data of the logic gate).

As a result of such absorption (e.g., optimization), the logic gate and the multiplexer will no longer be cascaded when implemented in the PLD, but rather may be absorbed into a single LUT, thereby freeing up the configurable PLD components that would otherwise be occupied by the multiplexer. Furthermore, because the logic gate and the multiplexer that follows will be configured within one configurable PLD component (e.g., a single logic block having a single LUT), the propagation delay of the combination of the logic gate and the multiplexer will be reduced, which in some cases may advantageously permit an increase in the clock frequency of a PLD configured with the user design.

In some embodiments, the optimization process may identify and absorb a chain of multiplexers into a chain of logic gates (e.g., an adder implemented using a carry chain or other logic operations chained via a carry chain), thereby freeing up a large number of configurable PLD resources efficiently.

In some embodiments, the converted user design and/or the optimized user design may be represented by a netlist that identifies various types of components provided by the PLD and their associated signals. In embodiments that produce a netlist of the converted user design, the optimization process may be performed on such a netlist.

Referring now to the drawings, FIG. 1 illustrates a block diagram of a PLD 100 in accordance with an embodiment of the disclosure. PLD 100 (e.g., a field programmable gate array (FPGA)), a complex programmable logic device (CPLD), a field programmable system on a chip (FPSC), or other type of programmable device) generally includes input/output (I/O) blocks 102 and logic blocks 104 (e.g., also referred to as programmable logic blocks (PLBs), programmable functional units (PFUs), or programmable logic cells (PLCs)).

I/O blocks 102 provide I/O functionality (e.g., to support one or more I/O and/or memory interface standards) for PLD 100, while programmable logic blocks 104 provide logic functionality (e.g., LUT-based logic or logic gate array-based logic) for PLD 100. Additional I/O functionality may be provided by serializer/deserializer (SERDES) blocks 150 and physical coding sublayer (PCS) blocks 152. PLD 100 may also include hard intellectual property core (IP) blocks 160 to provide additional functionality (e.g., substantially predetermined functionality provided in hardware which may be configured with less programming than logic blocks 104).

PLD 100 may also include blocks of memory 106 (e.g., blocks of EEPROM, block SRAM, and/or flash memory), clock-related circuitry 108 (e.g., clock sources, PLL circuits, and/or DLL circuits), and/or various routing resources 180 (e.g., interconnect and appropriate switching logic to provide paths for routing signals throughout PLD 100, such as for clock signals, data signals, or others) as appropriate. In general, the various elements of PLD 100 may be used to perform their intended functions for desired applications, as would be understood by one skilled in the art.

For example, I/O blocks 102 may be used for programming PLD 100, such as memory 106 or transferring information (e.g., various types of data and/or control signals) to/from PLD 100 through various external ports as would be understood by one skilled in the art. I/O blocks 102 may provide a first programming port (which may represent a central processing unit (CPU) port, a peripheral data port, an SPI interface, and/or a sysCONFIG programming port) and/or a second programming port such as a joint test action group (JTAG) port (e.g., by employing standards such as Institute of Electrical and Electronics Engineers (IEEE) 1149.1 or 1532 standards). I/O blocks 102 typically, for example, may be included to receive configuration data and commands (e.g., over one or more connections 140) to configure PLD 100 for its intended use and to support serial or parallel device configuration and information transfer with SERDES blocks 150, PCS blocks 152, hard IP blocks 160, and/or logic blocks 104 as appropriate.

It should be understood that the number and placement of the various elements are not limiting and may depend upon the desired application. For example, various elements may not be required for a desired application or design specification (e.g., for the type of programmable device selected).

Furthermore, it should be understood that the elements are illustrated in block form for clarity and that various elements would typically be distributed throughout PLD 100, such as in and between logic blocks 104, hard IP blocks 160, and routing resources 180 to perform their conventional functions (e.g., storing configuration data that configures PLD 100 or providing interconnect structure within PLD 100). It should also be understood that the various embodiments disclosed herein are not limited to programmable logic devices, such as PLD 100, and may be applied to various other types of programmable devices, as would be understood by one skilled in the art.

An external system 130 may be used to create a desired user configuration or design of PLD 100 and generate corresponding configuration data to program (e.g., configure) PLD 100. For example, system 130 may provide such configuration data to one or more I/O blocks 102, SERDES blocks 150, and/or other portions of PLD 100. As a result, programmable logic blocks 104, routing resources 180, and any other appropriate components of PLD 100 may be configured to operate in accordance with user-specified applications.

In the illustrated embodiment, system 130 is implemented as a computer system. In this regard, system 130 includes, for example, one or more processors 132 which may be configured to execute instructions, such as software instructions, provided in one or more memories 134 and/or stored in non-transitory form in one or more non-transitory machine readable mediums 136 (e.g., which may be internal or external to system 130). For example, in some embodiments, system 130 may run PLD configuration software, such as Lattice Diamond System Planner software available from Lattice Semiconductor Corporation to permit a user to create a desired configuration and generate corresponding configuration data to program PLD 100.

System 130 also includes, for example, a user interface 135 (e.g., a screen or display) to display information to a user, and one or more user input devices 137 (e.g., a keyboard, mouse, trackball, touchscreen, and/or other device) to receive user commands or design entry to prepare a desired configuration of PLD 100.

Figure 2:
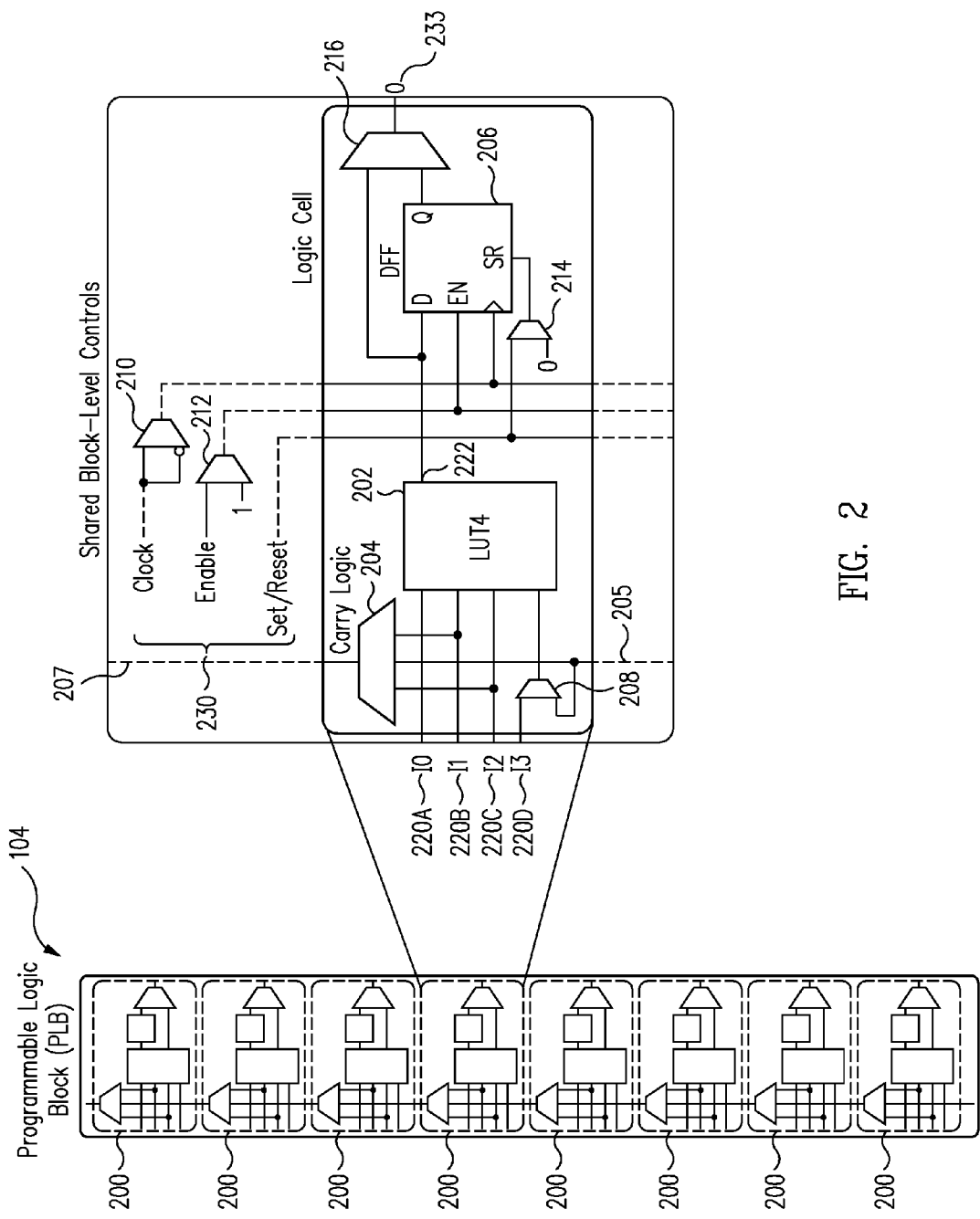
FIG. 2 illustrates a block diagram of a logic block for a PLD in accordance with an embodiment of the disclosure.

FIG. 2 illustrates a block diagram of a logic block 104 of PLD 100 in accordance with an embodiment of the disclosure. As discussed, PLD 100 includes a plurality of logic blocks 104 including various components to provide logic and arithmetic functionality.

In the example embodiment shown in FIG. 2, logic block 104 includes a plurality of logic cells 200. For example, each logic cell 200 may include various components such as: a lookup table (LUT) 202, a carry logic circuit 204, a latch 206 (e.g., register), and programmable multiplexers 208, 212, 214, and 216 for selecting desired signal paths for logic cell 200. In this example, LUT 202 accepts four inputs 220A-220D, which makes it a four-input LUT (which may be abbreviated as "4-LUT") that can be programmed by configuration data for PLD 100 to implement any appropriate logic operation having four inputs or less. LUT 202 in other examples may be of any other suitable size having any other suitable number of inputs for a particular implementation of a PLD. In some embodiments, different size LUTs may be provided for different logic blocks 104 and/or different logic cells 200.

An output signal 222 from LUT 202 may be passed through multiplexer 216 or register 206 to provide an output signal 233 of logic cell 200. Depending on the configuration of multiplexers 210-216, output signal 222 may be temporarily stored (e.g., latched) in latch 206 according to control signals 230. As discussed, configuration data for PLD 100 may configure output 233 of logic cell 200 to be provided as one or more inputs of another logic cell 200 (e.g., in another logic block or the same logic block) in a cascaded arrangement to configure logic operations that cannot be implemented in a single logic cell 200 (e.g., logic operations that have too many inputs to be implemented by a single LUT 202).

Carry logic circuit 204 may be utilized for some configurations of PLD 100 to efficiently implement arithmetic operations such as adders, subtractors, comparators, counters, or other operations, or to efficiently form some wide logic operations (e.g., working on multiple bit data). In this regard, carry logic circuits 204 across multiple logic cells 202 may be chained together to pass carry-in signals 205 and carry-out signals 207 between adjacent logic cells 202. In the example of FIG. 2, carry-in signal 205 may be passed to carry logic circuit 204 by configuring programmable multiplexer 208. In some embodiments, carry logic circuits 204 may be chained across multiple logic blocks 200. Carry logic circuit 204 may be implemented to provide a carry value for arithmetic operations or logic operations. For example, in one embodiment, carry logic circuit 204 may be implemented using a carry-multiplexer (also referred to as a "carry-mux").

Logic cell 200 illustrated in FIG. 2 is merely an example, and logic cells 200 according to different embodiments may include different combinations of PLD components. Also, although FIG. 2 illustrates logic block 104 having eight logic cells 200, logic block 104 according to other embodiments may include fewer logic cells 200 or more logic cells 200.

Each of the logic cells 200 of logic block 104 may be used to implement a portion of a user design implemented by PLD 100. In this regard, PLD 100 may include many logic blocks 104, each of which may include logic cells 200 and/or other components which are used to collectively implement the user design.

As further described herein, portions of a user design may be adjusted to occupy fewer logic cells 200 and/or fewer logic blocks 104 when PLD 100 is configured to implement the user design. Such adjustments according to various embodiments may identify certain arithmetic or logic operations that are followed by certain multiplexer operations to be implemented in a cascaded arrangement occupying multiple levels of logic cells 200 and/or logic blocks 104. As further described herein, a logic absorption process may rearrange various signal connections associated with the arithmetic/logic operations and the multiplexer operations that follow, such that the multiplexer operations may be absorbed into logic cells 200 and/or logic blocks 104 to be associated with the preceding arithmetic/logic operations.

Figure 3:
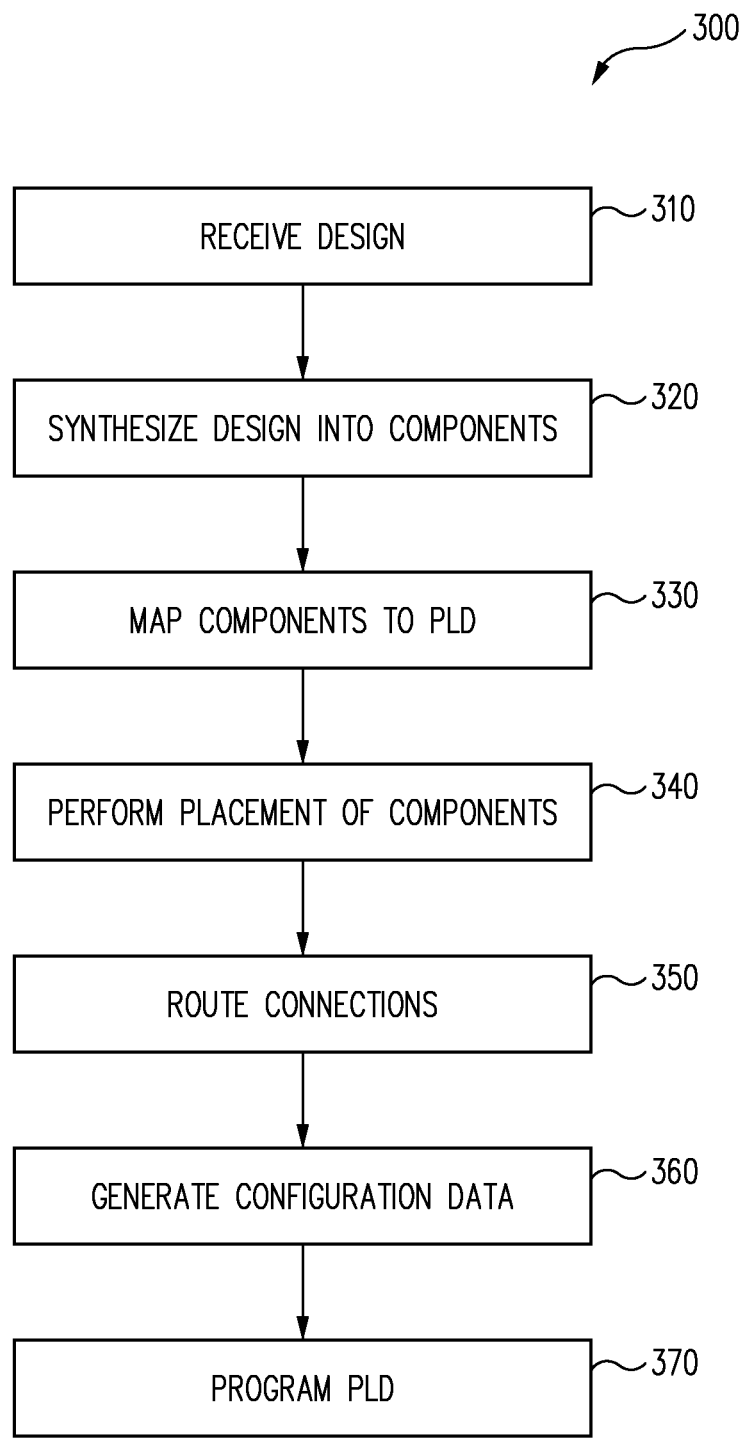
FIG. 3 illustrates a design process for a PLD in accordance with an embodiment of the disclosure.

FIG. 3 illustrates a design process 300 for a PLD in accordance with an embodiment of the disclosure. For example, the process of FIG. 3 may be performed by system 130 running Lattice Diamond software to configure PLD 100. In some embodiments, the various files and information referenced in FIG. 3 may be stored, for example, in one or more databases and/or other data structures in memory 134, machine readable medium 136, and/or otherwise.

In operation 310, system 130 receives a user design that specifies the desired functionality of PLD 100. For example, the user may interact with system 130 (e.g., through user input device 137 and hardware description language (HDL) code representing the design) to identify various features of the user design (e.g., high level logic operations, hardware configurations, and/or other features). In some embodiments, the user design may be provided in a register transfer level (RTL) description (e.g., a gate level description). System 130 may perform one or more rule checks to confirm that the user design describes a valid configuration of PLD 100. For example, system 130 may reject invalid configurations and/or request the user to provide new design information as appropriate.

In operation 320, system 130 synthesizes the design to create a netlist (e.g., a synthesized RTL description) identifying an abstract logic implementation of the user design as a plurality of logic components (e.g., also referred to as netlist components). In some embodiments, the netlist may be stored in Electronic Design Interchange Format (EDIF) in a Native Generic Database (NGD) file.

In some embodiments, synthesizing the design into a netlist in operation 320 may involve converting (e.g., translating) the high-level description of logic operations, hardware configurations, and/or other features in the user design into a set of PLD components (e.g., logic blocks 104, logic cells 200, and other components of PLD 100 configured for logic, arithmetic, or other hardware functions to implement the user design) and their associated interconnections or signals. Depending on embodiments, the converted user design may be represented as a netlist.

In some embodiments, synthesizing the design into a netlist in operation 320 may further involve performing an optimization process on the user design (e.g., the user design converted/translated into a set of PLD components and their associated interconnections or signals) to reduce propagation delays, consumption of PLD resources and interconnections, and/or otherwise optimize the performance of the PLD when configured to implement the user design. Depending on embodiments, the optimization process may be performed on a netlist representing the converted/translated user design. Depending on embodiments, the optimization process may represent the optimized user design in a netlist (e.g., to produce an optimized netlist).

In some embodiments, the optimization process may include optimizing certain instances of a logic gate feeding a multiplexer which, when a PLD is configured to implement the user design, would occupy multiple levels of configurable PLD components (e.g., logic cells 200 and/or logic blocks 104) in a cascaded arrangement. For example, as further described herein, the optimization process may include absorbing the multiplexer into the PLD component (e.g., logic cell 200 and/or logic block 104) associated with the logic gate when a certain instance of a logic gate feeding a multiplexer is identified from the user design, such that the logic gate and the multiplexer will no longer be cascaded in multiple levels of configurable PLD components when implemented.

In operation 330, system 130 performs a mapping process that identifies components of PLD 100 that may be used to implement the user design. In this regard, system 130 may map the optimized netlist (e.g., stored in operation 320 as a result of the optimization process) to various types of components provided by PLD 100 (e.g., logic blocks 104, logic cells 200, embedded hardware, and/or other portions of PLD 100) and their associated signals (e.g., in a logical fashion, but without yet specifying placement or routing). In some embodiments, the mapping may be performed on one or more previously-stored NGD files, with the mapping results stored as a physical design file (e.g., also referred to as an NCD file). In some embodiments, the mapping process may be performed as part of the synthesis process in operation 320 to produce a netlist that is mapped to PLD components.

In operation 340, system 130 performs a placement process to assign the mapped netlist components to particular physical components residing at specific physical locations of the PLD 100 (e.g., assigned to particular logic cells 200, logic blocks 104 and/or other physical components of PLD 100), and thus determine a layout for the PLD 100. In some embodiments, the placement may be performed on one or more previously-stored NCD files, with the placement results stored as another physical design file.

In operation 350, system 130 performs a routing process to route connections (e.g., using routing resources 180) among the components of PLD 100 based on the placement layout determined in operation 340 to realize the physical interconnections among the placed components. In some embodiments, the routing may be performed on one or more previously-stored NCD files, with the routing results stored as another physical design file.

Thus, following operation 350, one or more physical design files may be provided which specify the user design after it has been synthesized (e.g., converted and optimized), mapped, placed, and routed for PLD 100 (e.g., by combining the results of the corresponding previous operations). In operation 360, system 130 generates configuration data for the synthesized, mapped, placed, and routed user design. In operation 370, system 130 configures PLD 100 with the configuration data by, for example, loading a configuration data bitstream into PLD 100 over connection 140.

Figure 4:
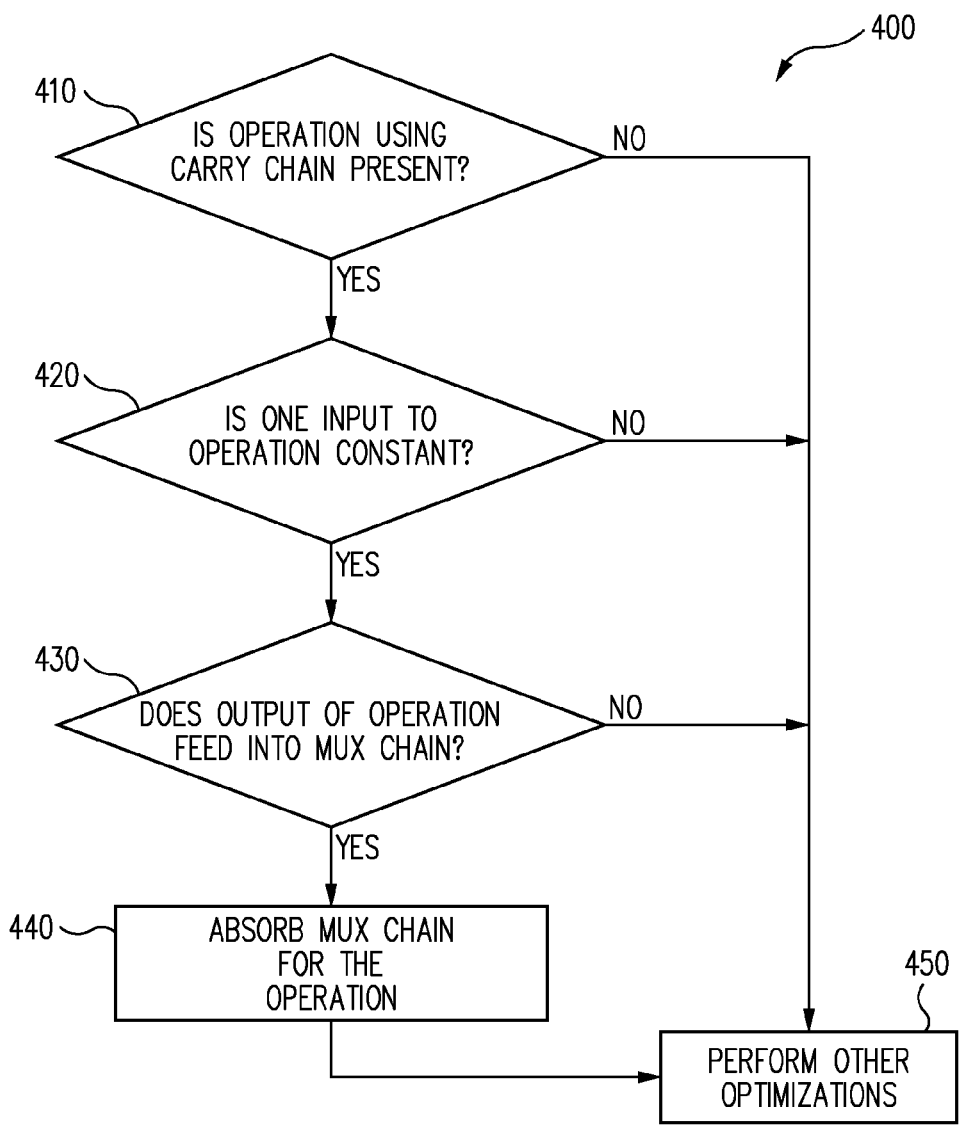
FIG. 4 illustrates a logic absorption process for a PLD in accordance with an embodiment of the disclosure.

FIG. 4 illustrates a logic absorption process 400 (e.g., also referred to as an optimization process) for a user design, in accordance with an embodiment of the disclosure. In some embodiments, logic absorption process 400 may be performed during operation 320 of process 300 as discussed above. Process 400 may be executed by system 130 to optimize certain instances of logic gates feeding multiplexers as discussed above. In particular, one or more embodiments of process 400 may optimize the user design for a PLD with logic blocks or logic cells that comprise four-input LUTs, such as the example of logic block 104 and logic cell 200 having LUT 202 shown in FIG. 2.

Figure 5:
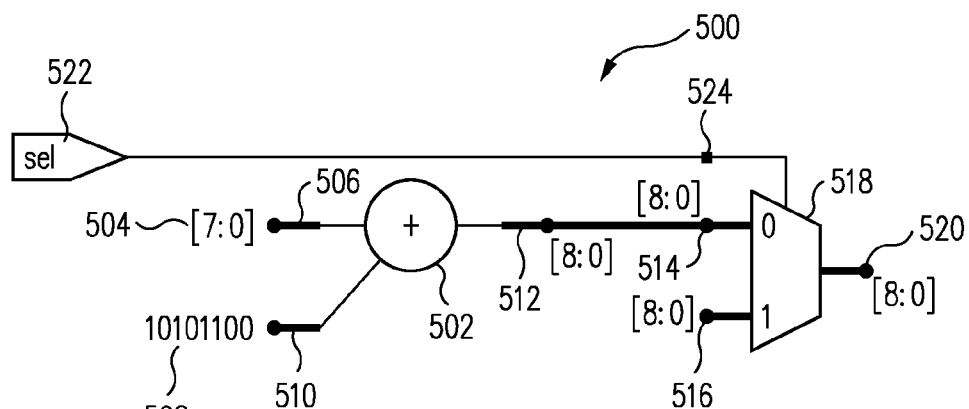
FIG. 5 illustrates a portion of a user design in accordance with an embodiment of the disclosure.

In various embodiments, process 400 may identify, from the user design, certain instances of arithmetic or logic operations that utilize a carry chain and feed their outputs to a chain of multiplexers. FIG. 5 illustrates an example of such an instance 500 according to an embodiment of the disclosure. In this example, an arithmetic operation 502 (shown in this example as an adder) takes in variable data 504 having a multi-bit width (8-bit-wide variable data shown and labeled by its bit range "[7:0]" in this example) as one input 506 and a multi-bit constant 508 (an 8-bit-wide literal operand is shown in this example) as another input 510. In general, such a multi-bit arithmetic operation 502 may be synthesized and mapped into multiple logic cells 200 chained via their carry logic circuits 204 to provide output data 512 that is one bit wider than input 506 or 510 (e.g., to include a last stage carry-out).

As further shown, output data 512 of arithmetic operation 502 is passed to input 514 of a 2-to-1 multiplexer 518 (e.g., a multiplexer having a fan-in size of 2), which provides an output signal 520 corresponding to either the signal received at input 514 or input 516, according to a select signal 522 received at its selection input 524. In some cases, multiplexer 518 may be implemented as a chain of 1-bit multiplexers sharing a common select signal 522. In some cases, each of such 1-bit multiplexers may be synthesized and mapped into a LUT or other PLD component as a three-input logic operation that receives one of its inputs from a LUT or other PLD component implementing a one bit portion of arithmetic operation 502.

Figure 6:
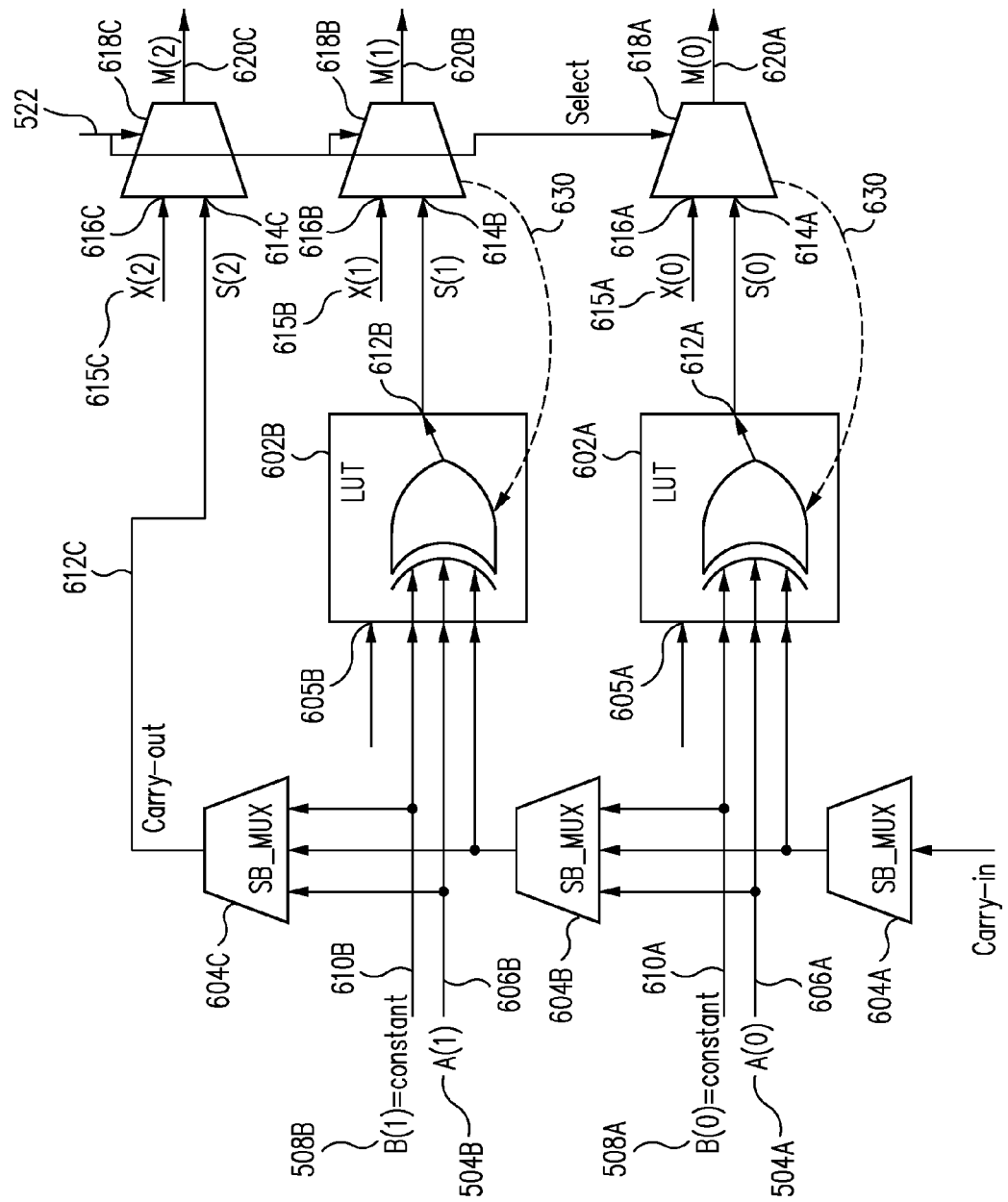
FIG. 6 illustrates another portion of a user design in accordance with an embodiment of the disclosure.

For example, FIG. 6 illustrates the example of FIG. 5 synthesized into a chain of carry logic circuits 604 (individually identified as carry logic circuits 604A, 604B, and 604C, and labeled "SB_MUX" in the illustrated embodiment) and LUTs 602 (individually identified as LUTs 602A and 602B) feeding their output signals 612 (individually identified as output signals 612A, 612B, and 612C corresponding to LUTs 602A, LUT 602B, and carry logic circuit 604C providing a last stage carry-out, respectively) to a chain of 1-bit, 2-to-1 multiplexers 618 (individually identified as multiplexers 618A, 618B, and 618C) sharing a select signal 522, in accordance with an embodiment of the disclosure. One-bit portions (labeled 504A/504B) of variable data 504 and one-bit portions (labeled 508A/508B) of constant 508 are assigned (via inputs 606A/606B and inputs 610A/610B, respectively) to each LUT 602 and the associated carry logic circuit 604 for a bit-wise computation of sum and carry values. Each multiplexer 618 passes either a one-bit portion of a multi-bit input signal 615 (one-bit portions identified as 615A, 615B, and 615C) received at inputs 616A, 616B, and 616C (collectively referred to as inputs 616) or output signal 612 of an associated LUT 602 or carry logic circuit 604 received at inputs 614A, 614B, and 614C (collectively referred to as inputs 614) as output signals 620A, 620B, and 620C (collectively referred to as output signal 620), according to select signal 522.

For clarity, FIG. 6 shows a chain for two bits of data, but it should be appreciated that the chain can be extended for the whole width of variable data 504, constant 508, or input signal 615. In some embodiments, such a chain of carry logic circuits 604, LUTs 602, and multiplexers 618 may be mapped to a first chain of logic cells 200 implementing multi-bit arithmetic operation 502 cascaded into (e.g., providing its output signal as an input signal into) a second chain of logic cells 200 implementing multiplexer 518, with each logic cell 200 in the first chain performing a bit-wise arithmetic operation and each logic cell 200 in the second chain performing a bit-wise multiplexing. Depending on the width of variable data 504, constant 508, or input signal 615, each chain of logic cells 200 may extend over one or more logic blocks 104 each having a plurality of logic cells 200, according to such embodiments. For example, with logic blocks 104 each comprising eight logic cells 200, a first logic block 104 may be configured for receiving and performing arithmetic operation 502 on 7-bit variable data and 7-bit constant data, which feeds its 8-bit output (including the last stage carry-out) as an input signal to a second logic block 104 configured for multiplexing 8-bit input signals. In another example, arithmetic operation 502 on 127-bit variable data and 127-bit constant data (or 128-bit variable data and 128-bit constant data, if a last stage carry-out can be ignored) may be synthesized and mapped to sixteen logic blocks 104 (each comprising eight logic cells 200) cascaded into another sixteen logic blocks 104 implementing a 128-bit multiplexer.

Returning to the example of FIG. 6, each LUT 602 is a four-input LUT used to implement a three-input XOR logic operation as part of an adder. Thus, each LUT 602 has an unused input 605A or 605B (collectively referred to as unused inputs 605) available. In other words, each four-input LUT 602 is only partially utilized to implement a three-input operation, but only has room to implement an additional logic operation having two inputs at most (e.g., unused input 605 plus the logic output of the XOR logic operation). As further described herein, process 400 may advantageously absorb multiplexers 618 (which are three-input operations to be implemented in separate LUTs or other PLD components) into LUTs 602, thereby reducing PLD resources that otherwise would be consumed to implement multiplexers 618.

Referring again to FIG. 4, in operation 410, system 130 determines whether an arithmetic or logic operation utilizing a carry chain is present in the user design (e.g., a portion of a user design similar to those illustrated in FIGS. 5 and/or 6).

If so, process 400 continues to operation 420 to check for other conditions for identifying appropriate instances to optimize. If not, process 400 continues to operation 450 to perform other optimizations if desired or available. In some embodiments, operation 410 may also include determining whether at least one unused input will be available in each PLD component (e.g., LUT 202) implementing a one-bit portion of the arithmetic or logic operation. In some cases, this may be determined from the specification of a target PLD (e.g., PLD 100) that describes, for example, the number of available inputs for each LUT (e.g., the size of each LUT), and may not need to be repeated every time an arithmetic or logic operation utilizing a carry chain is found. For example, if four-input LUTs are available in a target PLD to implement an arithmetic operation utilizing a carry chain, one unused input to the four-input LUTs will be expected to be available.

In operation 420, system 130 determines whether the arithmetic or logic operation utilizing a carry chain has a constant (e.g., constant 508) or a literal operand for one of its inputs. If so, process 400 continues to operation 430 to check for other conditions for identifying appropriate instances to optimize. If not, process 400 continues to operation 450.

In operation 430, system 130 determines whether the output of the arithmetic or logic operation utilizing a carry chain feeds into a chain of multiplexers (e.g., multiplexer 518 or multiplexer 618 sharing select signal 522). In some embodiments, operation 430 may also involve determining whether each multiplexer has an appropriate fan-in size in relation to the number of unused inputs and constant inputs in the PLD component (e.g., a LUT) programmed for a bit-wise implementation of the arithmetic or logic operation that precedes the multiplexer. For example, a 2-to-1 multiplexer may be suitable for optimization given a LUT in a preceding stage that has one unused input and one constant input. If the output of the arithmetic of logic operation utilizing a carry chain is found to supply input signals to a chain of multiplexers in operation 430, process 400 continues to operation 440 to optimize the identified instances of the arithmetic of logic operation feeding the chain of multiplexers. Otherwise, process 400 continues to operation 450.

It should be appreciated that operations 410, 420, and 430 may be performed in any appropriate order to identify suitable instances in the user design to optimize. For example, in some cases, it may be more efficient to identify constant inputs (e.g., literal operands) in the user design. In such cases, system 130 may first determine whether constant inputs are present in the user design to identify constant inputs, and then determine whether the identified constant inputs are provided as inputs to arithmetic or logic operations utilizing a carry chain.

Once suitable instances of an arithmetic or logic operation utilizing a carry chain and feeding a chain of multiplexers is determined to be present and identified through operations 410-430, an optimization may be performed on the identified instances by absorbing the multiplexers into LUTs or other PLD components implementing the arithmetic or logic operation, in operation 440.

Figure 7:
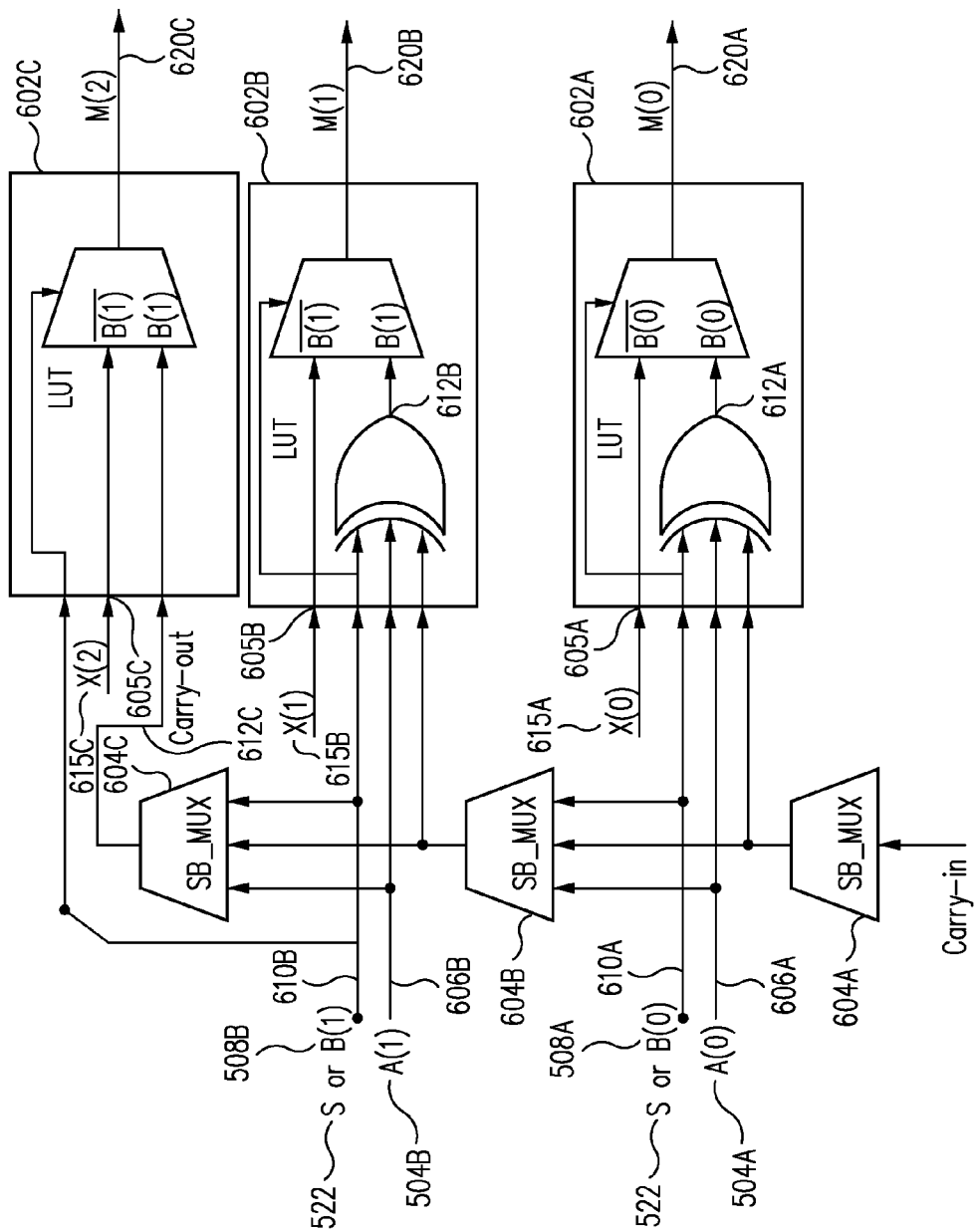
FIG. 7 illustrates the portion of the user design of FIG. 6 following a logic absorption process in accordance with an embodiment of the disclosure.

For example, FIG. 7 illustrates the example instance of FIG. 6 after operation 440 has been performed in accordance with an embodiment of the disclosure. According to one or more embodiments, operation 440 of process 400 may reassign select signal 522 for multiplexers 618 to inputs 610 of the carry chain (e.g., LUTs 602 and carry logic circuits 604), such that select signal 522 and constant 508 share inputs 610. In this regard, an assertion of select signal 522 may be mapped to each input 610 as a complement of the corresponding bit of constant 508 on the input 610. For example, if bit B(0) of constant 508 on a particular input 610 is 1, then an assertion (select=1) of select signal 522 (which was shared by all multiplexers 618 as shown in FIG. 6 prior to operation 440) may be provided as a 0 on the particular input 610 associated with that bit B(0) of constant 508.

The functionality of multiplexers 618 may be absorbed into LUTs 602 according to operation 440 of one or more embodiments of process 400, by reassigning input signal 615 associated with multiplexers 618 to corresponding unused inputs 605 of LUTs 602 (including input 605C of LUT 602C to implement multiplexer 618C for last stage carry-out 612C), and by programming LUTs 602 to pass input signal 615 received at inputs 605 when the complement of constant 508 is provided on inputs 610 and pass output signal 612 of the arithmetic operation when constant 508 is provided on inputs 610. Thus, output signal 620 of multiplexers 618 in FIG. 6 may now be provided by LUTs 602. Furthermore, since inputs 610 may be provided with constant 508 or its complement based on the same select signal 522, the functionality of multiplexers 618 absorbed in LUTs 602 may effectively operate together based on the same select signal 522. In this regard, LUT 602C, which implements multiplexer 618C for last stage carry-out 612C, also receives constant 508 or its complement (assertion of select signal 522) taken from input 610B of a previous carry stage, and thus implements multiplexer 618C that operates on the same select signal 522.

As may be appreciated, the output of the arithmetic operation (including the carry) will be incorrect when the complement of constant 508 is provided on inputs 610. However, process 400 advantageously reassigns various signals and inputs as discussed above, such that the functionality as a whole of the arithmetic operation and the multiplexers together is not affected. In other words, the reassigning of various signals and inputs to absorb the multiplexer functionality as discussed above takes advantage of the output of the arithmetic operation (including the carry) becoming irrelevant (e.g., becoming a "don't-care" value) when not selected by the multiplexer.

After optimizing suitable instances of an arithmetic or logic operation that utilizes a carry chain and feeds a multiplexer in operation 440, process 400 may continue to operation 450 to perform for other optimizations if desired or available. As discussed above, multi-bit-wide arithmetic or logic operations that utilize a carry chain and feed the output to a chain of multiplexers can be identified and optimized to free up a large number of configurable PLD resources in an efficient manner, given that arithmetic or logic operations in user designs are frequently multi-bit-wide operations. However, it should be understood that the optimization techniques discussed above may be applied to other instances in a user design where a logic gate, with or without a carry chain, feeds its output to a multiplexer. For example, instances of a logic gate followed by a multiplexer may be detected and further verified (e.g., by determining whether the number of unused inputs and the number of constant inputs in the LUT implementing the logic gate are sufficient in relation to the fan-in size of the multiplexer), which may then be optimized by absorbing the multiplexer into the LUT or other PLD component implementing the logic gate.

Therefore, in view of the present disclosure, it will be appreciated that the optimization techniques described herein may be used to identify and optimize various instances of logic gates feeding multiplexers. Without applying the optimization techniques of the present disclosure, such instances in the user design would occupy multiple levels of configurable PLD components in a cascaded arrangement when a PLD is configured to implement the user design. As discussed above, the optimization techniques may absorb the multiplexers into the LUTs or other PLD components implementing the logic gate, such that the logic gate and the multiplexer will no longer be cascaded in multiple levels of configurable PLD components when implemented. Such an optimization may beneficially reduce consumption of configurable PLD resources, and in some cases may permit an increase in the clock frequency of a PLD configured with the user design for an increase computational performance.

Where applicable, various embodiments provided by the present disclosure can be implemented using hardware, software, or combinations of hardware and software. Also where applicable, the various hardware components and/or software components set forth herein can be combined into composite components comprising software, hardware, and/or both without departing from the spirit of the present disclosure. Where applicable, the various hardware components and/or software components set forth herein can be separated into sub-components comprising software, hardware, or both without departing from the spirit of the present disclosure. In addition, where applicable, it is contemplated that software components can be implemented as hardware components, and vice-versa.

Software in accordance with the present disclosure, such as program code and/or data, can be stored on one or more non-transitory machine readable mediums. It is also contemplated that software identified herein can be implemented using one or more general purpose or specific purpose computers and/or computer systems, networked and/or otherwise. Where applicable, the ordering of various steps described herein can be changed, combined into composite steps, and/or separated into sub-steps to provide features described herein.

Embodiments described above illustrate but do not limit the invention. It should also be understood that numerous modifications and variations are possible in accordance with the principles of the present invention. Accordingly, the scope of the invention is defined only by the following claims.

We claim:

1. A method performed by a processor configured to comprising:
   receiving, in the processor, a design identifying operations to be performed by a programmable logic device (PLD);
   synthesizing, in the processor, the design into a plurality of PLD components comprising a first logic block cascaded into a second logic block, wherein the first logic block comprises a plurality of look-up tables (LUTs) to perform an operation to provide a multi-bit signal;
   wherein the second logic block implements a multiplexer adapted to selectively pass the multi-bit signal;
   further synthesizing in the processor, the design to absorb the multiplexer into the first logic block the further synthesizing comprising identifying at least one unused input of each LUT of the first logic block; and
   generating configuration data to configure physical components of the PLD in accordance with the further synthesized design.

2. The computer-implemented method of claim 1, wherein a first data signal is configured to alternate between a constant data value and its complement to selectively pass a first input signal or a second input signal.

3. The computer-implemented method of claim 1, wherein the operation is a multi-bit addition operation performed on first and second data signals.

4. The computer-implemented method of claim 1, wherein the first logic block further comprises a carry chain to perform the operation.

5. The computer-implemented method of claim 1, wherein the first logic block comprises a plurality of logic cells;
   each LUT is associated with a corresponding one of the logic cells.

6. The computer-implemented method of claim 1, wherein:
   the multiplexer comprises a plurality of one-bit-wide multiplexers; and each LUT is a four-input LUT.

7. The computer-implemented method of claim 6, wherein: each one-bit-wide multiplexer has a fan-in size of two.

8. The computer-implemented method of claim 1, further comprising:
   programming the PLD with the configuration data.

9. A system comprising:
   a processor; and
   a memory adapted to store a plurality of computer readable instructions which when executed by the processor are adapted to cause the system to perform a computer-implemented method comprising:
   receiving a design identifying operations to be performed by a programmable logic device (PLD),
   synthesizing the design into a plurality of PLD components comprising a first logic block cascaded in to a second logic block the first logic block comprising a plurality of look-up tables (LUTs) to perform an operation to provide a first multi-bit input signal,
   wherein the second logic block implements a multiplexer adapted to selectively pass the first multi-bit input signal received from the first logic block or a second multi-bit input signal, and
   further synthesizing the design to absorb the multiplexer into the first logic block.

10. The system of claim 9, wherein the operation is a multi-bit addition operation performed on first and second data signals.

11. The system of claim 9, wherein the first logic block further comprises a carry chain to perform the operation.

12. The system of claim 9, wherein:
   the first logic block comprises a plurality of logic cells; and
   each LUT is associated with a corresponding one of the logic cells.

13. The system of claim 9, wherein:
   the multiplexer comprises a plurality of one-bit-wide multiplexers; and each LUT is associated with a corresponding one of the logic cells.

14. The system of claim 9, wherein the computer-implemented method further comprises:
   generating configuration data to configure physical components of the PLD in accordance with the further synthesized design; and
   programming the PLD with the configuration data.

15. A non-transitory machine-readable medium storing a plurality of machine-readable instructions which when executed by one or more processors of a computer system are adapted to cause the computer system to perform a computer-implemented method comprising:
   receiving a design identifying operations to be performed by a programmable logic device (PLD),
   synthesizing the design into a plurality of PLD components comprising a first logic block cascaded in to a second logic block the first logic block comprising a plurality of look-up tables (LUTs) to perform an operation to provide a first multi-bit input signal,
   wherein the second logic block implements a multiplexer adapted to selectively pass the first multi-bit input signal received from the first logic block or a second multi-bit input signal, and
   further synthesizing the design to absorb the multiplexer into the first logic block.

* * * * *